United States Patent [19]

Hansen

[11] Patent Number: 4,891,825
[45] Date of Patent: Jan. 2, 1990

[54] FULLY SYNCHRONIZED PROGRAMMABLE COUNTER WITH A NEAR 50% DUTY CYCLE OUTPUT SIGNAL

[75] Inventor: Kenneth A. Hansen, Bedford, Tex.

[73] Assignee: Motorola, Inc., Schaumburg, Ill.

[21] Appl. No.: 154,160

[22] Filed: Feb. 9, 1988

[51] Int. Cl.⁴ .................... H03K 5/04; H03K 23/66
[52] U.S. Cl. ........................ 377/52; 377/110; 307/265; 328/58; 331/1 A
[58] Field of Search ............ 377/52, 110; 307/265; 328/58

[56] References Cited

U.S. PATENT DOCUMENTS

| | | | |
|---|---|---|---|
| 3,478,225 | 11/1969 | Bryant | 307/219.1 |
| 4,053,739 | 10/1977 | Miller et al. | 364/703 |
| 4,156,204 | 5/1979 | Hargis | 331/12 |
| 4,316,151 | 2/1982 | Ooms | 331/1 A |
| 4,325,031 | 4/1982 | Ooms et al. | 331/1 A |
| 4,330,751 | 5/1981 | Swain | 377/52 |
| 4,339,722 | 7/1982 | Sydor | 377/52 |
| 4,475,086 | 10/1984 | Allen | 307/265 |
| 4,585,957 | 4/1986 | Ooms | 307/455 |
| 4,623,846 | 11/1986 | La Macchia | 307/265 |
| 4,669,099 | 5/1987 | Zinn | 307/265 |
| 4,726,045 | 2/1988 | Caspell et al. | 328/58 |
| 4,754,163 | 6/1988 | Aue et al. | 307/265 |
| 4,807,266 | 2/1989 | Taylor | 328/58 |

Primary Examiner—John S. Heyman
Attorney, Agent, or Firm—Steven G. Parmelee

[57] ABSTRACT

A method and arrangement for a fully synchronized, programmable frequency divider is disclosed that exhibits a near 50% duty cycle output signal independent of the divisor, whether even or odd, and that is suitable for use in a phase-locked loop (PLL) frequency synthesizer. As described in a first embodiment, the arrangement includes a data loader 31, a counter 32, a half-period detector 33, and a synchronizer 34. Next, a fast-locking, low-noise PLL frequency synthesizer is disclosed incorporating the fully synchronized, 50% duty cycle divider, and having a reference signal generator 71-72, a phase detector 73, a controlled oscillator 74-75, and the fully synchronized, programmable frequency divider 76. In a second embodiment, a fully synchronized programmable divider is described, including a data loader 31, a counter 32, a half-period detector 33', a synchronizer 34', and an additional block 82, a half-clock period detector. Synchronizer 34' is modified to include an additional block 84, an output logic circuit, which allows for an output signal duty cycle virtually equal to 50% for odd as well as even integer divisors.

16 Claims, 6 Drawing Sheets

—PRIOR ART—

FIG. 1

—PRIOR ART—

FULLY SYNCHRONIZED PROGRAMMABLE COUNTER WITH A NEAR 50% DUTY CYCLE OUTPUT SIGNAL

BACKGROUND OF THE INVENTION

The present invention relates generally to programmable counters, i.e., frequency dividers, and, more specifically, to an arrangement and method for a fully synchronized frequency divider exhibiting a near 50% duty cycle output signal especially suited for use in phase locked loop (PLL) frequency synthesizers.

One application for PLL frequency synthesizers is in modern communications systems, which require more efficient use of the limited and congested radio spectrum. To achieve more efficient use of this limited congested spectrum, such systems are utilizing high-speed data and elaborate signalling schemes to achieve greater message signal throughput. Such high speed data and elaborate signalling schemes, however, demand greater performance from the transmitter designed into such two-way radios. That is, these radios are required to achieve phase-lock quickly and to maintain an accurate carrier frequency with low noise and minimal jitter.

Furthermore, in mobile, and particularly portable applications, it is desirable to configure the PLL frequency synthesizer with programmable counters/frequency dividers, which draw a minimum amount of current appropriate for the application. Particularly, the programmable counter should be configured in such a way as to allow the use of low speed, minimal current drain dividers where appropriate within the chain of cascaded dividers therein, and reserve the use of high-speed, high current drain dividers for the first, initial input stages.

In addition, and in conflict with the above requirements, such programmable counters/frequency dividers should have a synchronized output signal and synchronized data loading to alleviate frequency jitter, or phase noise, inherent in commonly-available programmable counters utilized in such applications. The above problems are particularly troublesome when attempting to design a frequency-agile PLL frequency synthesizer for use with a two-way radio transmitter and receiver that is suitable for handling voice and high-speed data over relatively narrow bandwidth radio channels that are spaced very close together.

In any event, certain programmable counters are known which merely address one of the previously-mentioned constraints.

One such type of known counter has a 50% duty cycle, but requires a prime factor of two that limits its usefulness to applications where the selected integer, or divisor, N, is even. Although such counters provide an exact 50% duty cycle, almost all PLL frequency synthesizer applications for two-way radios require that the programmed count, N, span a range of integers, including odd as well as even integers within the range.

A second known type of programmable counter provides a near 50% duty cycle, but cannot be synchronously changed from one count or program state, $N_1$, to another program state, $N_2$. The main disadvantage of utilizing this type of counter is that the programmed count, N, changes state dependent on internal gate delays and may not coincide with the optimum point in time at which the change of state should occur. Furthermore, the gate delays are highly dependent on environmental conditions, such as temperature.

A third known type of counter provides an output signal which is not synchronized to the clock, or input signal. Such synchronization, however, is essential for low noise, minimal frequency jitter operation.

In general, programmable counters/frequency dividers not providing a near 50% duty cycle output signal typically have a duty cycle equal to or less than 1/N, where N is the selected divisor. In addition, the duty cycle is limited in such counters by the internal gate delays. Hence, the disadvantage of utilizing this type of counter is that stages following this low-duty cycle counter must operate at near the same frequency as the input frequency, even though N may be large and the counter output frequency may be much less than the input frequency. Thus, it is clear that this general group of counters is unsuitable and must be avoided, since choosing a counter having a near 50% duty cycle output signal clearly alleviates this disadvantage.

Accordingly, there exists a need for a fully synchronized, programmable counter/frequency divider exhibiting a near 50% duty cycle output signal independent of N, having synchronized data loading of a binary-encoded integer as the programmed count, or divisor, N, and having an output signal synchronized to the input signal. Such need exists for many applications requiring a fast-locking, low-noise, frequency synthesizer.

SUMMARY OF THE INVENTION

It is an object of the present invention to provide a programmable counter/frequency divider which overcomes the foregoing deficiencies by exhibiting a near 50% duty cycle output signal having synchronized data loading and a synchronized output signal with respect to the input signal which is independent of the divisor, N, whether even or odd.

It is a further object of the present invention to provide a fast-locking, low-noise, frequency synthesizer incorporating the programmable counter of the foregoing type which exhibits the characteristics previously enumerated. Such characteristics are beneficial regardless of where a designer chooses to place the programmable counter within the PLL frequency synthesizer.

In practicing the invention, one embodiment contemplates a fully synchronized, programmable, frequency divider circuit that exhibits a near 50% duty cycle output signal which is independent of the divisor, N. This programmable divider comprises a counter, a data loader, a half-period detector, and a synchronizer to achieve synchronous data loading and a synchronized output signal having a near 50% duty cycle which is independent of the present divisor.

In another embodiment, a fully synchronized programmable frequency divider of the foregoing type further includes a half-clock period detector and an output logic decoder. These cooperate to provide an output signal having a duty cycle, virtually equal to 50%, which is independent of the present divisor, whether even or odd.

Either of the referenced embodiments may be advantageously utilized in a PLL frequency synthesizer that includes at least a reference signal generator, a phase detector, and a controlled oscillator (modulated by voice and data) having a feedback path. As will be seen, this PLL has fast-locking, low-noise capabilities by virtue of having at least one of the fully synchronized, programmable dividers therein.

BRIEF DESCRIPTION OF THE DRAWINGS

Referring to the drawings, wherein like reference numerals indicate like elements in these several figures and in which.

DETAILED DESCRIPTION OF THE PREFERRED EMBODIMENT

Figure 1:
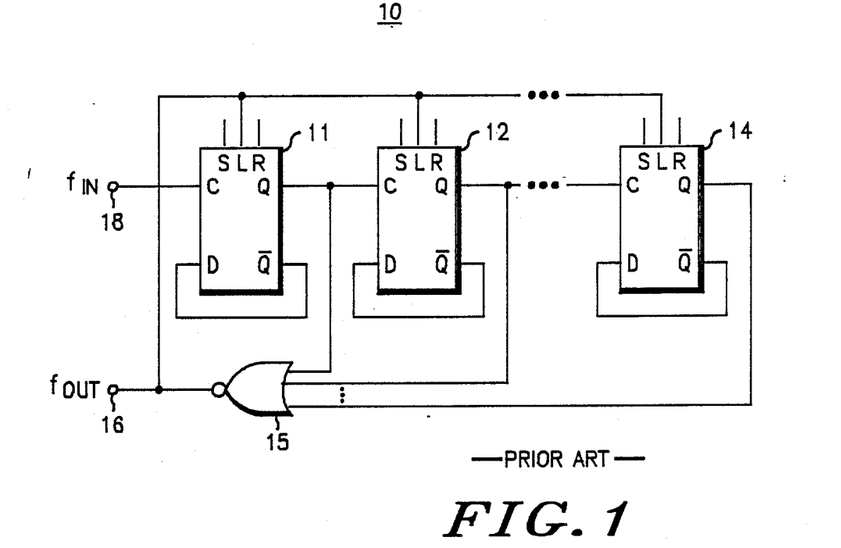
FIG. 1 is a block diagram of a programmable counter, or frequency divider, typical of the known art.

Referring to the drawings, a basic programmable frequency divider arrangement, known in the art, is shown at 10 in FIG. 1. This divider is shown to include a plurality of cascaded flip-flops 11, 12, 14, and a logic gate 15 to provide the frequency divided output signal at node 16 which is related to the input signal at node 18, according to a programmable divisor, N. The divisor, N, is programmed in binary form to each of flip-flops 11, 12, and 14 at the S, set, and R, reset, inputs as shown.

Figure 2:
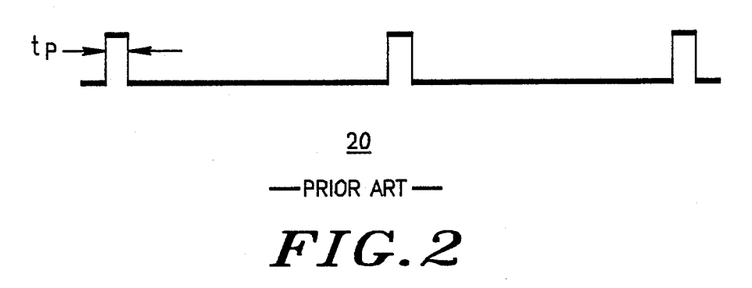
FIG. 2 is a representation of the output signal provided by the type of programmable frequency divider depicted in FIG. 1.

Next, FIG. 2 shows an output waveform having a relatively low duty cycle which is typical of the known programmable counters shown in FIG. 1. This output waveform, as depicted in FIG. 2, consists of narrow pulses, each having a pulse width labelled $t_p$ which is a positive pulse having a width less than or equal to one period of the input signal or clocking waveform. This is due to the fact that the NOR gate 15 of FIG. 1 will provide a logical 1 output only when all of the Q outputs of the flip-flops are at a logical 0. The output of the NOR gate will remain at logical 1 only as long as all Q outputs remain at logical 0.

Moreover, given the simplicity of FIG. 1, the output signal at node 16 is also utilized to reload the programming information available at the S, R inputs of each of the flip-flops. An additional gate delay later, the output of NOR gate 15 goes to a logical 1, starting a positive pulse. This pulse causes the programming information, or data, to be loaded some gate delays later, which changes the state of at least one Q output of the included flip-flops to a logical 1. Upon detecting this change of at least one Q output state, NOR gate 15 again changes to a logical 0 one gate delay later, ending the positive pulse. All but this last transition must occur within one clock period of the input signal, or else the counter will operate improperly.

Therefore, in this type of frequency divider, the positive pulse width at node 16, depicted as $t_p$ in FIG. 2, must be less than or equal to one clock period, and furthermore, its occurence is delayed by NOR gate 15, which introduces additional frequency jitter or phase noise. Such characteristics are a distinct disadvantage when utilizing this type of frequency divider in a PLL, because although the frequency of the waveform of FIG. 2 can be much less than the frequency of the incoming signal, the circuitry being driven by this output signal must be able to see and effectively respond to a narrow pulse width equal to one half $t_p$, which still has a relatively high frequency component. Therefore, although this type of frequency divider is capable of reducing the rate of pulse occurrences, the frequency performance requirement for subsequent circuitry has not been reduced significantly, since at most it has been reduced only by a factor of 2, due to the extremely low duty cycle output signal.

The ideal solution to the above deficiencies requires a programmable frequency divider having a 50% duty cycle output signal, independent of the divisor N, whether an even or an odd integer.

During initial breadboard testing of a fully programmable frequency divider, a solution was found only for N having even integers. For this embodiment when attempting to divide by odd values of N, the worst case occurs for N equals 3, which is within 1 count of being at a 50% duty cycle, namely 33%. This embodiment was accomplished by studying the following logic table.

| N | Full Period (Binary Equivalent) | | | | Half Period (Binary Equivalent) | | | |
|---|---|---|---|---|---|---|---|---|
|   | MSB | | | LSB | MSB | | | LSB |
| 8 | 1 | 0 | 0 | 0 | 4 | 0 | 1 | 0 | 0 |
| 7 | 0 | 1 | 1 | 1 | 3 | 0 | 0 | 1 | 1 |
| 6 | 0 | 1 | 1 | 0 | 3 | 0 | 0 | 1 | 1 |
| 5 | 0 | 1 | 0 | 1 | 2 | 0 | 0 | 1 | 0 |
| 4 | 0 | 1 | 0 | 0 | 2 | 0 | 0 | 1 | 0 |
| 3 | 0 | 0 | 1 | 1 | 1 | 0 | 0 | 0 | 1 |
| 2 | 0 | 0 | 1 | 0 | 1 | 0 | 0 | 0 | 1 |
| 1 | 0 | 0 | 0 | 1 | | | | | |
| 0 | 0 | 0 | 0 | 0 | | | | | |

Figure 3:
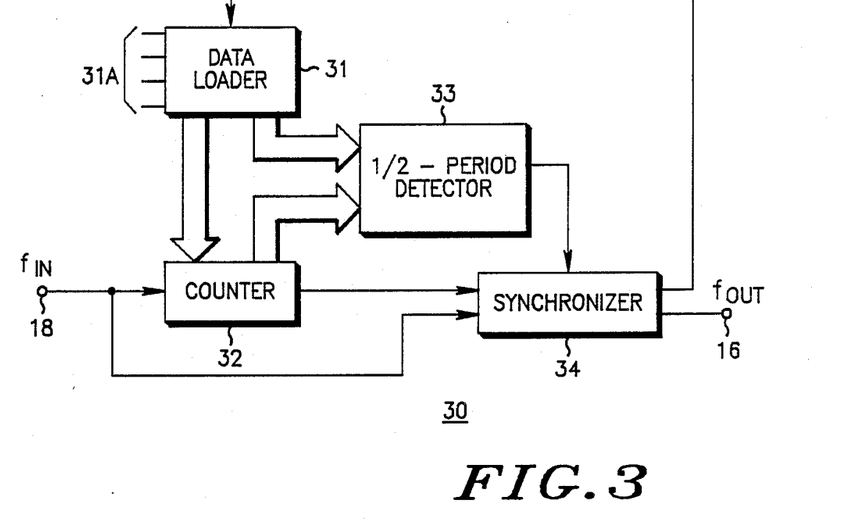
FIG. 3 is a simplified block diagram of one embodiment of the fully synchronized programmed counter according to the present invention.

Moreover, considering the need for synchronization of the output signal and the data loading to the counters within the frequency divider, a viable solution to the above-mentioned deficiencies is achieved by the arrangement shown at 30 in FIG. 3. Upon analyzing the logic table given above, it can be seen that if each of the most significant bits down through the second least significant bit of a binary-encoded integer (inputted as the divisor N via data input lines 31A) is stored in latches in data loader 31 and then compared to each of the bits from the second most significant bit down through the least significant bit in counter 32, then a half period point corresponding to a 50% duty cycle can be determined when these are exactly equal. This half-period detector 33, therefore, is coupled to the data loader 31 and counter 32 and provides an indication thereof to synchronizer 34, as shown.

Figure 4:
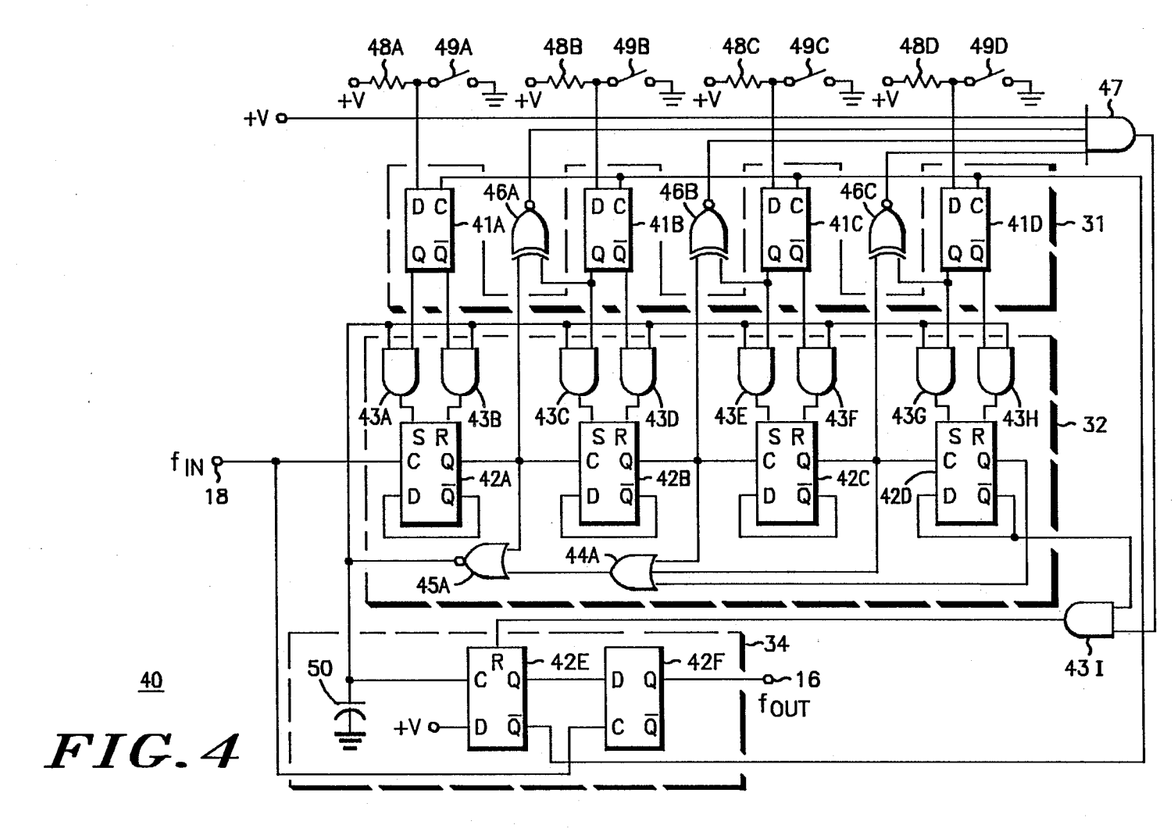
FIG. 4 is a detailed schematic diagram of the programmable counter depicted in FIG. 3.

Turning next to FIG. 4, there is depicted at 40 a more detailed schematic diagram of the fully synchronized programmable frequency divider, according to the present invention. Note that data loader 31 includes a plurality of latches 41A, 41B, 41C, and 41D, the actual number dependent on the maximum divisor N, to be achieved. In this case there are four latches to permit division by a divisor, N, as large as 16. Each of these latches 41A, 41B, 41C, and 41D include an enable input, labeled C, as well as dual outputs Q and Q inverse, which couple to counter 32. Counter 32 includes pairs of AND gates 43A-43H which have outputs coupled to the set, S, and reset, R, inputs of flip-flops 42A, 42B, 42C, and 42D. Each of these flip-flops 42A, 42B, 42C, and 42D may be of the same type as flip-flops 11, 12, on up to 14 depicted in FIG. 1, or they may be configured with separate pairs of AND gates 43A-43H, as shown here.

Counting means 32 also includes OR gate 44A and NOR gate 45A, the former having multiple inputs which connect to the Q outputs of each of the flip-flops 42B, 42C, and 42D, as shown. OR gate 44A has an output feeding NOR gate 45A, which has a second input coupled to the Q output of the first flip-flop 42A, as shown in FIG. 4. Both of these gates cooperate to provide a reduced time for decoding when the counter state C is currently equal to 0, and cooperate to arrive at the selected integer by counting in a downward direction.

As can be seen from the schematic diagram of FIG. 4, multiple-input OR gate 44A has an output which changes less often than the output of flip-flop 42A, so that NOR gate 45A presents the only gate delay encountered when decoding the counter state C equal to 0. The output of NOR gate 45A couples to the loading, L, ports of the flip-flops, if configured like those 11-14 depicted in FIG. 1, or to each of the second inputs of AND gates 43A-43H, which in turn couple to flip-flops 42A, 42B, 42C, and 42D, if configured as shown in FIG. 4. The output of NOR gate 45A also couples to synchronizer 34, which includes capacitor 50 and a first synchronization flip-flop, 42E. Capacitor 50 ensures that the R input of 42E goes low before the C input goes high. Flip-flop 42E is a resettable D type flip-flop which has an R port coupled to AND gate 43I and a Q output coupled to the D input of a second synchronization flip-flop 42F. The Q inverse output from flip-flop 42E is utilized for synchronizing data loader 31 by means of parallel-connected enable ports (labeled C) on each of the included latches 41A, 41B, 41C, and 41D, as shown.

The second synchronization flip-flop, 42F, is shown as a D type flip-flop having a C, clock, input coupled to the input signal node 18, as shown. The Q output of flip-flop 42F provides the output signal at node 16, as shown.

Although not shown within a dotted line, half-period detector 33 includes EXCLUSIVE NOR gates 46A, 46B, 46C, as well as AND gates 47 and 43I. Note that the first EXCLUSIVE NOR gate 46A is coupled to the Q output of flip-flop 42A and the Q output of latch 41B. In this manner, EXCLUSIVE NOR gate 46A effects one of the bit comparisons within half-period detector 33 described in conjunction with the Logic Table. Similarly, EXCLUSIVE NOR gate 46B couples to the Q output of flip-flop 42B and the Q output of latch 41C next following latch 41B. Finally, EXCLUSIVE NOR gate 46C couples to the Q output of flip-flop 42C and also to the Q output of latch 41D.

The data input lines corresponding to lines 31A are connected to pull-up resistors 48A-48D and switches 49A-49D, which together provide external programming capability to enter a new or same (old) integer in binary-encoded form for loading this selected integer into the counter as the present divisor.

In operation, assume that the counter flip-flops 42A, 42B, 42C, 42D are programmed to the state N via the latches 41A-41D in data loader 31, and assume that the output signal at node 16 is at a logic 1. As a result, the EXCLUSIVE NOR gates 46A, 46B, and 46C are checking for the state: INTEGER (N/2). When this half-period state is found, the output of AND gates 47 and 43I will reset synchronizer 34 flip-flops 42E and 42F, causing the output signal at node 16 to make a logical 1 to 0 transition. The counter 32, meanwhile, continues to count down to the logical state 0 which causes a logical 0 to 1 transition at the Clock input of flip-flop 42E, and loads the new programming information into the counters from the latches 41A, 41B, 41C, and 41D.

By waiting until a transition is made at the output of flip-flop 42E, a synchronous changeover between programming counts is made. That is to say, the last output period equals the input period times $N_{old}$, and the next output period equals the input period times $N_{new}$. Loading at any prior time would cause the last period to be less than the product of the input period times $N_{old}$. Since there are N total counts and INTEGER (N/2) high counts, the duty cycle can be mathematically determined as a percentage duty cycle equal to INTEGER (N/2) divided by N times 100%. As a result, for N even, the percentage duty cycle equals N/2 divided by N times 100%, or 50%. For N odd, let $N=(2M+1)$, where M is even and thus the percentage duty cycle equals M divided by (2M+1) times 100%. Hence, for large M, the percentage duty cycle approaches 50%, while for small M, such as M=1, the worst-case duty cycle equals 33.3%. The condition for N even is depicted as being exactly 50% duty cycle in FIG. 5, while the worse case condition for N odd is given by FIG. 6, which shows the worst-case duty cycle as 33.3% when N equals 3.

Figure 7:
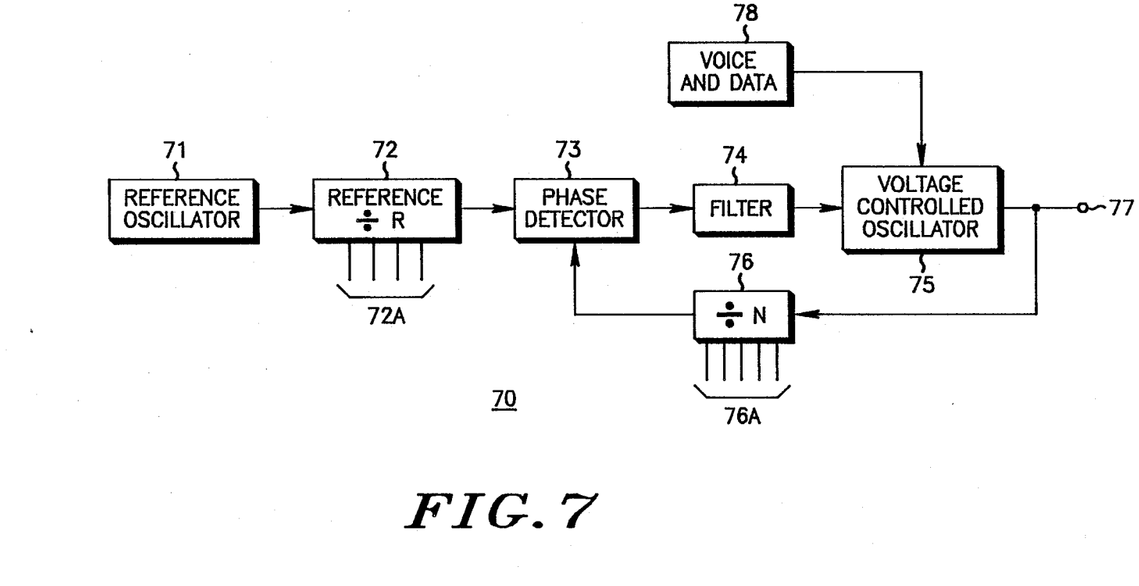
FIG. 7 is a block diagram of a fast-locking, low-noise, frequency synthesizer incorporating the fully synchronized, programmable counter arrangements depicted in FIG. 3 and FIG. 4.

Next, FIG. 7 depicts at 70 a PLL having the fully synchronized, programmable divider according to the first embodiment. As shown, this PLL includes reference oscillator 71 coupled to reference divider 72, which may be fixed or variable, having a divisor, R, and input lines 71A. By utilizing a fully synchronized, programmable counter, this variable reference divider provides a way in which to quickly and easily modify the frequency spacing between selected output frequencies within the range provided by the PLL, since the smallest frequency spacing possible for the output signal is directly dependent on the reference frequency supplied to the phase detector 73.

Reference divider 72 couples to one input of phase detector 73, which has an output coupled to a controlled oscillator, in this case shown as made up of filter 74 and voltage-controlled oscillator (VCO) 75. The output of VCO 75 couples to an input of a channel select, programmable divider 76 and to output signal port 77. Programmable divider 76 has an output which couples to a second input of phase detector 73 to provide the channel selection of the output frequency appearing at port 77. This divider permits fast-locking, low-noise operation, by loading a new divisor changing output state at an optimum point in time synchronized with the input signal to minimize frequency jitter and phase noise.

Voice and data stage 78 represents typically known circuits which control the modulation deviation of the RF signal generated by VCO 75. By virtue of incorporating the fully synchronized, programmable divider in the PLL, an output signal is generated that is suitable for handling voice and high-speed data modulation and that is able to be changed in channel frequency or channel spacing, or both, while exhibiting fast-locking, low-noise characteristics. Such a PLL frequency synthesizer arrangement is useful for providing a fast-locking, low-noise, modulated output signal over a wide band frequency range.

Figure 8:
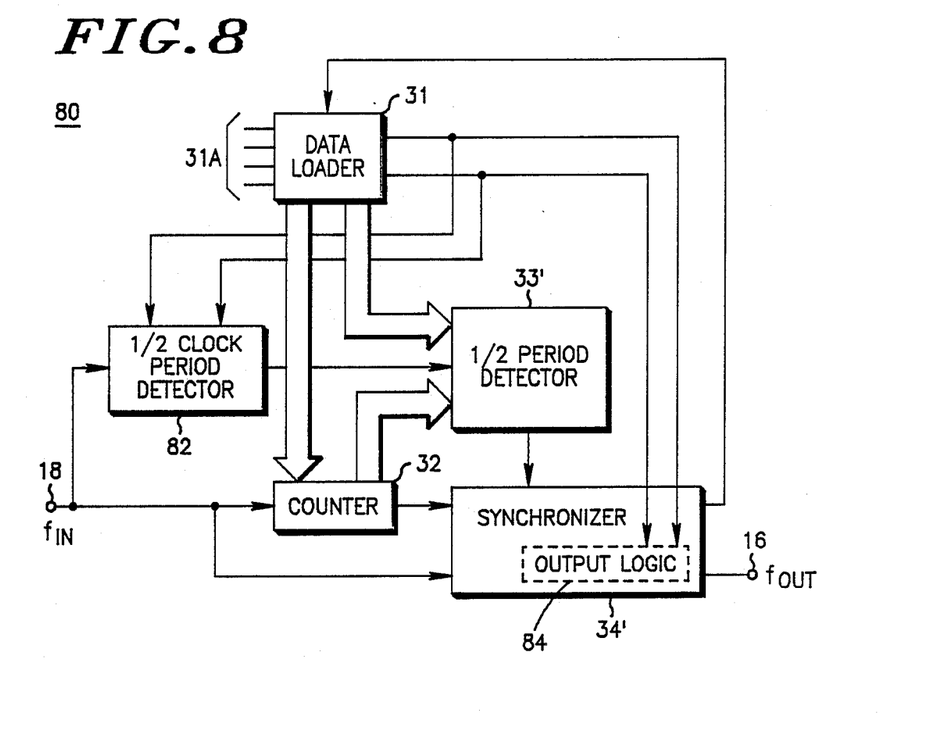
FIG. 8 is a simplified block diagram of another embodiment of the fully synchronized programmable counter.

Turning to FIG. 8, there is shown at 80 a block diagram of a second embodiment which includes data loader 31, counter 32, half-period detector 33', synchronizer 34', and an additional block, the half-clock period detector 82.

Block 82 provides an indication of where the half-clock period of the input signal occurs depending on whether an even or an odd integer has been selected. This is necessary since, in order to achieve a 50% duty cycle for integer divisors which are odd, both the high and low intervals must be made equal to each other and include a fraction equal to a one-half clock period. For example, if N=3 (and thus an odd integer divisor), then in order to achieve a 50% duty cycle, both the high and low intervals of the output signal must be equal to 1.5 clock periods.

Data loader 31 and counter 32 consist of the same structure and perform the same function as that depicted in FIG. 3, while modifications have been made to half-period detector 33' and synchronizer 34' to include additional circuitry configured for handling odd integers in a manner different from that for even integers. The details of each of these blocks can best be seen by turning next to the schematic diagram depicted in FIG. 9.

Figure 9:
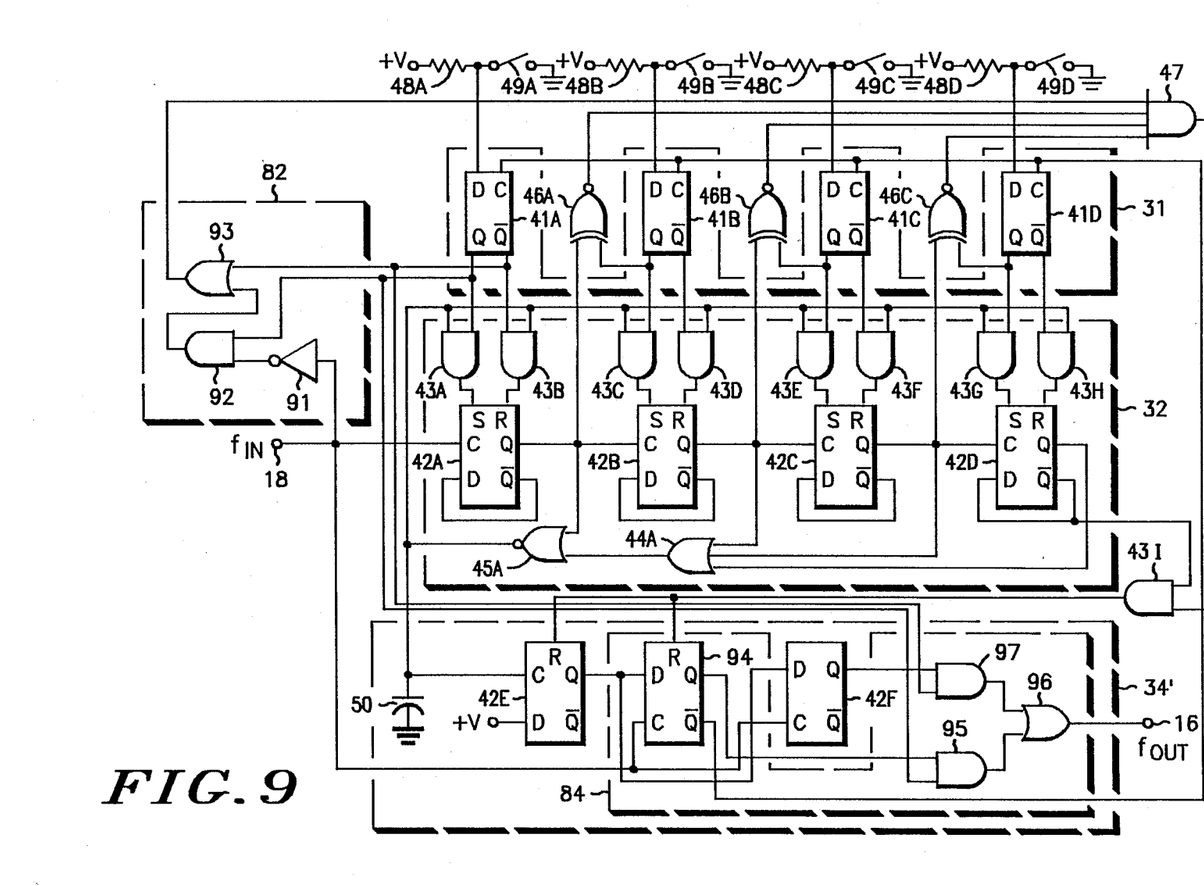
FIG. 9 is a detailed schematic diagram of the programmable counter depicted in FIG. 8.

Turning now to FIG. 9, there is shown at 90 a more detailed schematic diagram of the second embodiment given generally in FIG. 8. Note that FIG. 9 resembles FIG. 4, with the exception of additional blocks 82 and 84. Block 82 represents the half-clock period detector, and block 84 represents the output logic, respectively. Such a programmable divider may be implemented utilizing readily available off-the-shelf parts that provide the depicted configurations within each block.

In operation, the programmable divider depicted in FIG. 9 operates like that depicted in FIG. 4, with the additional feature that half-clock period detector 82 utilizes the information at latch 41A to sense whether an even or an odd integer divisor has been entered into the programmable counter. As shown, Block 82 includes an inverter 91, an AND gate 92, and an OR gate 93, arranged to provide the needed information. Output logic circuit 84, as shown, includes an additional D flip-flop 94, an AND gate 95, as well as an AND gate 97, which couples to the Q output of D flip-flop 42F and to the Q inverse of latch 41A, as shown. The output of AND gate 97 couples to a second input of OR gate 96, whose output provides the output signal at node 16.

Thus, if the Q inverse output of latch 41A is a logical 1, then the divisor is EVEN and the circuit operation is similar to the first embodiment, with the path going through flip-flop 42F as well as gates 97 and 96.

If, on the other hand, the Q output of latch 41A is at a logical 1, then the divisor is ODD and the path selected through output logic circuit 84 includes flip-flop 94 as well as gates 95 and 96.

One minor assumption made throughout the operation of the above programmable divider, for the case when the integer divisor is odd, is that the incoming signal at node 18 is required to be substantially equal to a 50% duty cycle waveform. This means that, in a typical application where the programmable divider is used after an oscillator having a sinusoidal output, all that is required to convert the sinusoidal signal to a square wave having virtually a 50% duty cycle is a zero-crossing detector which triggers, or changes state, at the zero crossings of the sinusoidal input signal. Thus, it will be apparent to those skilled in the art that in FIG. 7 such a zero-crossing detector may be utilized ahead of reference divider (R) 72, or ahead of programmable divider (N) 76, depending on the particular application involved.

Figures 5, 6:
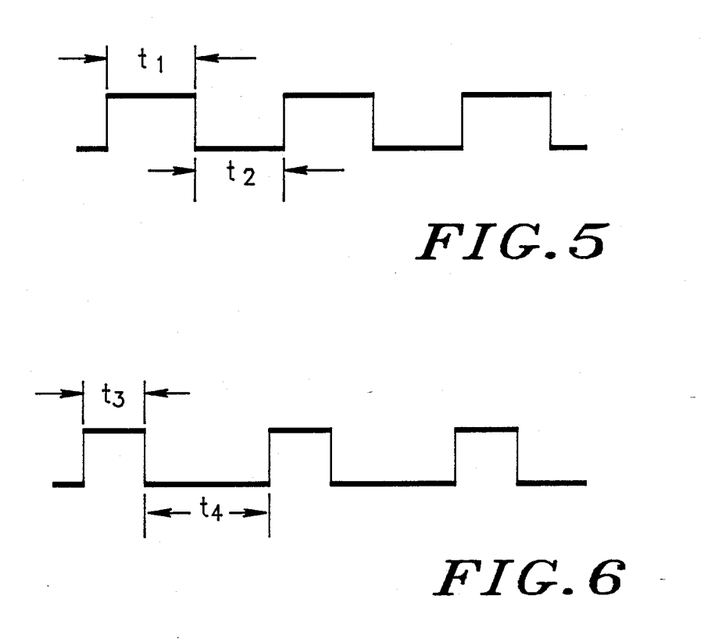
FIG. 5 is a representation of the output signal having substantially an exact 50% duty cycle for even integer divisors for the counter depicted in FIG. 3.
FIG. 6 is a representation of the output signal for the counter depicted in FIG. 3 during worst-case conditions, when the divisor N equals 3.

In contrast to the first embodiment programmable divider, in which the worst case duty cycle was 33.3% for N=3 as given by FIG. 6, the operation of the second embodiment of the present invention for N=3 is best seen by referring to FIG. 10, consisting of FIGS. 10A–10E.

Figure 10A:
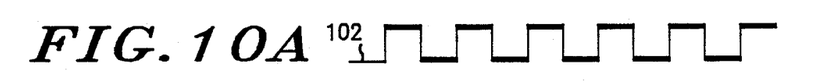
FIGS. 10A, 10B, 10C, 10D, and 10E represent the input signal, several intermediate signals, and the virtually uniform 50% duty cycle output signal for even and odd integer divisors for the counter depicted in FIG. 9.
Figure 10B:
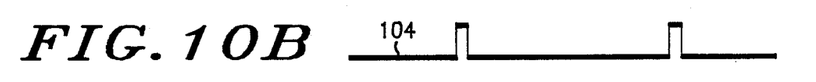
Figure 10C:
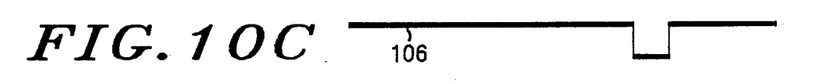
Figure 10D:
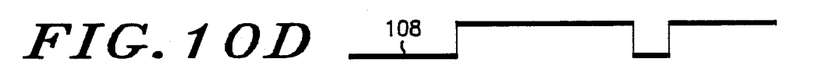
Figure 10E:
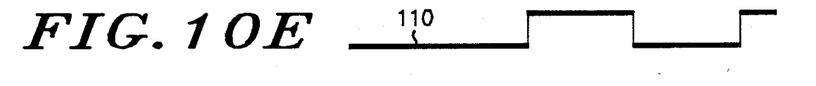

FIG. 10A shows input signal 102 having the required approximate 50% duty cycle, as discussed above. FIG. 10B depicts waveform 104 which represents the output signal from NOR gate 45A of FIG. 9. FIG. 10C depicts waveform 106 which represents the output from AND gate 47. FIG. 10D depicts waveform 108 which shows the Q output from D flip-flop 42E. FIG. 10E depicts waveform 110 which shows the Q output of D flip-flop 94 which exits to output node 16 for this ODD integer divisor via AND gate 95 and OR gate 96 to provide the divided output signal that is ⅓ the frequency of the input signal represented by waveform 102 in FIG. 10A. Note that for clarity the waveforms of FIG. 10A–10E are rendered as ideal timing diagrams having no gate delays shown. However, the only gate delay of significance is that contributed by NOR gate 45A, which was discussed earlier with regard to FIG. 4.

In operation, beginning with waveform 104 making a logical 0 to 1 transition at the output of NOR gate 45A and representing the state (C) of counter 32 changing from C=1 to C=0, the transition causes the Q output of flip-flop 42E to change from a logical 0 to a logical 1. On the next input signal pulse, the counter changes from C=3 to C=2, and the Q output of D flip-flop 94 changes from logical 0 to 1 and is effectively the circuit output signal. On the next input signal pulse, the counter changes from the state C=2 to C=1. At this time all inputs to AND gate 47 are logical 1, except for the output of OR gate 93 which is detecting the logical 1 to 0 transition of the input signal, thus splitting it in half.

On the next input signal transition from logical 1 to 0, the AND gate 47 changes state, causing flip-flop 94 to be reset. On the next input signal pulse, the counter changes from C=1 to C=0, causing a logical 0 to 1 transition at the output of NOR gate 44A and consequently at the output of flip-flop 42E. The Q output signal from flip-flop 42E is then passed through the synchronizer flip-flop 94 on the next input signal pulse, completing the cycle.

Thus, it can be readily seen that the output signal Q of flip-flop 94 is a 50% duty cycle waveform for N=3.

Note that all other ODD divisors work in a similar fashion, whereby the reset pulse occurs when the counter state C equals $[(M-1)/2]$ and the input signal (or clock) goes low, where M represents the selected integer as the present divisor.

The upper frequency limit for the input signal is dependent on the ripple delay through counter 32 when comparing each individual Q output with the original data stored in data loader 31 via EXCLUSIVE OR gates 46A-46C. The worse case (for counter state C=14 or 15) occurs when the half-period detector checks for C=7 since, in going from C=8 to C=7, it requires that all the toggles change state in a one-half clock period. Such a requirement may be stated as:

$$F_{in}(\max) \simeq F_{toggle} \frac{(\max)}{2N}, \text{ where } N = \# \text{ of bits}.$$

As a result, each of the above arrangements is able to overcome the limitations of the known art. That is, the embodiments and method provide a fully synchronized, programmable frequency divider that exhibits a near 50% duty cycle output signal suitable for use in PLL frequency synthesizers requiring fast-lock and low-noise charcteristics.

Although the arrangements of the present invention fully disclose many of the attendant advantages, it is to be understood that various changes and modifications not depicted herein are apparent to those skilled in the art. Therefore, even though the form of the above-described invention is merely a preferred or exemplary embodiment given with various alternatives, further variations may be made in the form, construction, and arrangement of the parts without departing from the scope of the above invention.

I claim:

1. Apparatus for a fully synchronized, programmable frequency divider exhibiting a near 50% duty cycle output signal which is independent of the divisor therein, whether even or odd, the apparatus comprising:
   (a) counting means for counting to a selected integer so that division of an applied input signal frequency is accomplished by a divisor equalling the selected integer;
   (b) data loading means, responsive to a command signal, for storing and then automatically loading a new or same integer into said counting means to provide the selected integer as a present divisor for said counting means;
   (c) half-period detecting means, coupled to the counting means and the data loading means, for detecting an integer-approximated half-period of the input signal by compairing when the count within the counting means equals the state INTEGER (N/2) and outputting an indicating thereof; and
   (d) synchronizing means, coupled to the counting means and the data loading means, and responsive to the indication outputted from the half-period detecting means, for synchronizing the data loading of said counting means, and for synchronizing the output signal with respect to the input signal, thereby providing a near 50% duty cycle output signal which is independent of the present divisor therein.

2. The apparatus according to claim 1, wherein said counting means comprises a plurality of cascaded flip-flops, a NOR gate, and an OR gate, so as to provide the divisor given by the selected integer.

3. The apparatus according to claim 1, wherein said counting means includes a plurality of cascaded flip-flops configured and arranged to count downward in order to effect the present divisor.

4. The apparatus according to claim 1, wherein said data loading means comprises a plurality of latches.

5. The apparatus according to claim 1, wherein said half-period detecting means comprises a plurality of EXCLUSIVE NOR gates and an AND gate configured to detect a count which is approximately one-half of said selected integer utilized for the divisor.

6. The apparatus according to claim 1, wherein said half-period detecting means comprises a plurality of EXCLUSIVE NOR gates and an AND gate configured to detect a count which is exactly one-half of said selected integer utilized for the divisor when said integer is even, and to detect a count which is approximately one-half of said selected integer utilized for the divisor when said integer is odd.

7. The apparatus according to claim 1, wherein said synchronizing means comprises a first resettable flip-flop and a second flip-flop, said first flip-flop for automatically loading data into said counting means, and both of said first and said second flip-flops for synchronizing the output signal with respect to the input signal.

8. Apparatus for a fully synchronized, programmable frequency divider exhibiting an output signal which has a duty cycle virtually equal to 50% and independent of the divisor therein, whether even or odd, the apparatus comprising:
   (a) counting means for counting to a selected integer so that division of an applied input signal frequency is accomplished by a divisor equalling the selected integer;
   (b) data loading means, responsive to a command signal, for storing and then automatically loading a new or same integer into said counting means to provide the selected integer as a present divisor for said counting means;
   (c) half-clock period detecting means, coupled to the counting means and the data loading means as well as to the input signal, for detecting only when said selected integer is odd, a half clock period of the input signal and providing an indication thereof;
   (d) half-period detecting means, coupled to the counting means, the data loading means, and the half-clock period detecting means, for detecting a half-period of the input signal by compairing when the count within the counting means equals the state (N/2) and outputting an exact indication thereof; and
   (e) synchronizing means, coupled to, the counting means, the data loading means the half-clock period detecting means and responsive to the indication outputted from the half-period detecting means, for synchronizing the data loading of said counting means and for synchronizing the output signal with respect to the input signal, said output signal routed through included output logic means depending on whether said divisor is even or odd, thereby providing an output signal having a duty cycle, virtually equal to 50%, which is independent of the present divisor therein.

9. The apparatus according to claim 8, wherein said counting means comprises a plurality of cascaded flip-flops, a NOR gate, and an OR gate, so as to provide the divisor given by the selected integer.

10. The apparatus according to claim 8, wherein said counting means includes a plurality of cascaded flip-flops configured and arranged to count downward in order to effect the present divisor.

11. The apparatus according to claim 8, wherein said data loading means comprises a plurality of latches.

12. The apparatus according to claim 8, wherein said half-period detecting means comprises a plurality of exclusive NOR gates and an AND gate configured to detect a count which is exactly one-half of said selected integer utilized for the divisor when said integer is even, and to detect a count which is exactly one-half of said selected integer utilized for the divisor when said integer is odd.

13. The apparatus according to claim 8, wherein said half-clock period detecting means comprises an inverter, an AND gate, and an OR gate, coupled to (a), (b), (c) above, as well as to the input signal.

14. The apparatus according to claim 8, wherein said synchronizing means comprises:
first and second synchronization flip-flops, said first flip-flop outputting a synchronized control signal to said second flip-flop which is clocked by the input signal; and said output logic circuit comprises:
a third flip-flop and an array of logic gates which synchronize the data loading into said counter, and which permit synchronization of the output signal for even integer divisors by utilizing said second flip-flop, and for odd integer divisors by utilizing said third flip-flop.

15. A method for providing a near 50% duty cycle output signal from a frequency divider such that the duty cycle is approximately independent of the divisor therein, whether even or odd, the method comprising the steps of:
(a) counting to a selected integer so that division of an applied input signal frequency is accomplished by a divisor equalling the selected integer;
(b) storing, and then automatically loading, a new or same integer into a counter to provide the selected integer as a present divisor for the counter;
(c) detecting an integer-approximated half-period of the input signal by comparing when the count determined in step (a) equals the state INTEGER (N/2) and outputting an approximate indication thereof; and
(d) synchronizing the data loading of said counter by inhibiting the data loading upon receiving the indication from step (c), so that the output signal remains synchronized with respect to the input signal by holding the output signal level until the input signal has changed state.

16. A method for providing an output signal from a frequency divider such that the duty cycle is virtually equal to 50% and is independent of the divisor therein, whether even or odd, the method comprising the steps of:
(a) counting to a selected integer so that division of an applied input signal frequency is accomplished by a divisor equalling the selected integer;
(b) storing, and then automatically loading, a new or same integer into a counter to provide the selected integer as a present divisor for the counter;
(c) detecting, only when said selected integer is odd, a half clock period of the input signal and providing an indication thereof;
(d) detecting a half-period of the input signal by comparing when the count determined in step (a) equals the state (N/2) and outputting an exact indication thereof; and
(e) synchronizing the data loading of the counter and synchronizing the output signal with respect to the input signal, including routing the output signal depending on whether said divisor is even or odd, thereby providing an output signal having a duty cycle, virtually equal to 50%, which is independent of the present divisor therein.

* * * * *

UNITED STATES PATENT AND TRADEMARK OFFICE
CERTIFICATE OF CORRECTION

PATENT NO. : 4,891,825

DATED : January 2, 1990

INVENTOR(S) : Kenneth A. Hansen

It is certified that error appears in the above-identified patent and that said Letters Patent is hereby corrected as shown below:

Col. 9, line 55, "indicating" should be --indication--.

Col. 10, line 49, "compairing" should be --comparing--.

Signed and Sealed this

Fourth Day of December, 1990

Attest:

HARRY F. MANBECK, JR.

Attesting Officer

Commissioner of Patents and Trademarks